US010209145B2

(12) United States Patent
You et al.

(10) Patent No.: US 10,209,145 B2
(45) Date of Patent: Feb. 19, 2019

(54) FAILURE DIAGNOSIS METHOD AND SYSTEM OF TEMPERATURE SENSOR OF SWITCH DEVICE

(71) Applicant: Hyundai Motor Company, Seoul (KR)

(72) Inventors: Chang Seok You, Gyeonggi-do (KR);
Min Su Kang, Gyeonggi-do (KR);
Sung Do Kim, Gyeonggi-do (KR);
Dong Hun Lee, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 171 days.

(21) Appl. No.: 15/378,475

(22) Filed: Dec. 14, 2016

(65) Prior Publication Data

US 2018/0058952 A1    Mar. 1, 2018

(30) Foreign Application Priority Data

Sep. 1, 2016    (KR) .................. 10-2016-0112838

(51) Int. Cl.
*G01K 15/00*    (2006.01)
*H02P 29/68*    (2016.01)
*G01R 31/02*    (2006.01)
*H02P 29/024*    (2016.01)

(52) U.S. Cl.
CPC ......... *G01K 15/007* (2013.01); *G01K 15/002* (2013.01); *G01R 31/025* (2013.01); *H02P 29/024* (2013.01); *H02P 29/68* (2016.02); *G01K 2205/00* (2013.01)

(58) Field of Classification Search
USPC ........................................... 374/1, 141, 163
See application file for complete search history.

(56) References Cited

U.S. PATENT DOCUMENTS

| 2014/0358391 A1* | 12/2014 | Kakihara | ............. G01K 15/007 701/70 |
| 2015/0006017 A1* | 1/2015 | Kwak | ................ B60H 1/00385 701/29.2 |
| 2015/0107345 A1* | 4/2015 | Sugimoto | ................ F01P 11/16 73/114.68 |

FOREIGN PATENT DOCUMENTS

| JP | 2006-003198 A | 1/2006 |
| JP | 2009-171702 A | 7/2009 |
| JP | 2010-217103 A | 9/2010 |
| JP | 2011-007542 A | 1/2011 |
| JP | 2016-043741 A | 4/2016 |
| KR | 10-2015-0072478 A | 6/2015 |
| KR | 10-1567256 B1 | 11/2015 |
| KR | 10-1616335 B1 | 4/2016 |
| WO | 2015/029686 A1 | 3/2015 |

* cited by examiner

*Primary Examiner* — Mirellys Jagan
(74) *Attorney, Agent, or Firm* — Mintz Levin Cohn Ferris Glovsky and Popeo, P.C.; Peter F. Corless

(57) ABSTRACT

A failure diagnosis method of a temperature sensor of a switch device is provided. The method includes setting a sampling period using a temperature detected by the temperature sensor of the switch device and a temperature of cooling water for cooling the switch device. A temperature sensing value detected by the temperature sensor is then compared with a temperature reference value stored in a memory in the sampling period to determine whether failure occurs in the temperature sensor.

13 Claims, 3 Drawing Sheets

FAILURE DIAGNOSIS METHOD AND SYSTEM OF TEMPERATURE SENSOR OF SWITCH DEVICE

CROSS-REFERENCE TO RELATED APPLICATION

This application claims the priority benefit of Korean Patent Application No. 10-2016-0112838, filed on Sep. 1, 2016 in the Korean Intellectual Property Office, the disclosure of which is incorporated herein by reference.

BACKGROUND

1. Field of the Invention

The present invention relates to a failure diagnosis method and system of a temperature sensor installed in a switch device, for pre-shutting current to protect a system when a temperature of the switch device exceeds a normal range.

2. Description of the Related Art

An inverter controller for driving a motor generates current supplied to the motor in the form of alternating current (AC) waveform and adjusts a period thereof to adjust motor current and speed through a pulse width modulation (PWM) switching method using an insulated gate bipolar transistor (IGBT). In particular, the IGBT may perform switching to supply current and, in this case, heat is generated.

When an amount of heat generated by an IGBT exceeds temperature limit specifications proposed by a company that manufactures the IGBT, a lifetime of the IGBT is reduced and failure of the IGBT occurs. Accordingly, a general inverter includes a cooling system that cools an IGBT operating as a main heat source and an inverter for a vehicle generally uses a water cooling system. In particular, generally, when a temperature of the IGBT is sensed, is abnormally increased for various reasons such as abnormality of a cooling system, abnormality of components, or the like, and exceeds a normal range, an inverter controller is configured to pre-shut current to protect the system.

Accordingly, when abnormality (e.g., connector disconnection, short circuit, noise, abnormality on PCB pattern, and hardware error of cold soldering) occurs during sensing of an IGBT temperature and the IGBT temperature is not normally sensed, an inverter output may be shut down in a normal operating state and normal driving of an entire vehicle system is obstructed or abnormality of the IGBT temperature is not detected, causing damage to the inverter. Thus, diagnosis of whether sensing of the IGBT temperature is normal and ensuring the reliability of a sensed value of an IGBT temperature are important technological key aspects in a power system using a switching device such as an IGBT.

The above information disclosed in this section is merely for enhancement of understanding of the background of the invention and therefore it may contain information that does not form the prior art that is already known in this country to a person of ordinary skill in the art.

SUMMARY

Therefore, the present invention provides a failure diagnosis method and system of a temperature sensor installed in a switch device, for determining whether failure occurs in the temperature sensor of the switch device using the temperature of the switch device without an additional temperature or flow sensor of cooling water.

In accordance with an aspect of the present invention, a failure diagnosis method of a temperature sensor of a switch device may include setting a sampling period using a temperature detected by the temperature sensor of the switch device and a temperature of cooling water for cooling the switch device and comparing a temperature sensing value detected by the temperature sensor and a temperature reference value stored in a memory in the sampling period and determining whether failure occurs in the temperature sensor.

The setting of the sampling period may include setting, as the sampling period, a time period in which the temperature detected by the temperature sensor is increased and the temperature of the cooling water remains constant as time elapses. The switch device may be configured to adjust current required to drive a motor, and the setting of the sampling period may include setting, as the sampling period, a time period in which the temperature detected by the temperature sensor is increased and the temperature of the cooling water remains constant as time elapses during operation of the switch device to switch the motor to a driving state from a stop state.

A controller may be configured to operate the switch device to output a greater amount of current than required current when the motor is switched to the driving state from the stop state, and the sampling period may be started from a time point at which the switch device outputs the required current. The determination of whether failure occurs may include comparing the temperature sensing value and the temperature reference value at a preset reference time interval in the sampling period and determining whether failure occurs in the temperature sensor.

The temperature reference value may be determined based on an amount of heat absorbed into the switch device and an amount of heat transferred to the cooling water. The temperature reference value may be determined according to the following equation.

$$T_1(t)=(T_1(0)-T_2(0)-c*m*R_{th})*\exp(-t/(c*m*R_{th}))+T_2(0)+c*m*R_{th}$$

wherein $T_1(t)$: temperature reference value after time t elapses in sampling period, $T_1(0)$: initial temperature sensing value in sampling period, $T_2(0)$: initial temperature of cooling water in sampling period, c: specific heat of switch device, m: mass of switch device, $R_{th}$: synthesized thermal resistance The controller may be configured to determine the temperature sensor to be normal when a difference between a temperature sensing value and a temperature reference value after the reference time elapses in the sampling period is less than a preset error range and determine that failure occurs in the temperature sensor when the difference between the temperature sensing value and the temperature reference value after the reference time elapses is equal to or greater than the error range.

The method may further include storing, in the memory, a time when failure occurs in the temperature sensor in the sampling period and analyzing a reason for or cause of the failure of the temperature sensor as contact inferiority when the time stored in the memory is aperiodically distributed in the sampling period. Additionally, the method may include storing, in the memory, the temperature sensing value when failure occurs in the temperature sensor in the sampling period and analyzing a reason for the failure of the temperature sensor as short circuit when temperature sensing values stored in the memory are the same.

In accordance with another aspect of the present invention, a failure diagnosis system of a temperature sensor of a switch device may include the temperature sensor configured to detect a temperature of the switch device, a cooling flow channel and cooling water for cooling the switch device, a memory configured to store a temperature reference value, and a controller configured to set a sampling period using the temperature detected by the temperature sensor and the temperature of the cooling water, compare the temperature reference value and the temperature sensing value detected by the temperature sensor in the sampling period to determine whether failure occurs in the temperature sensor. The controller may further be configured to set a time period in which the temperature detected by the temperature sensor is increased while the temperature of the cooling water remains constant, as the sampling period.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
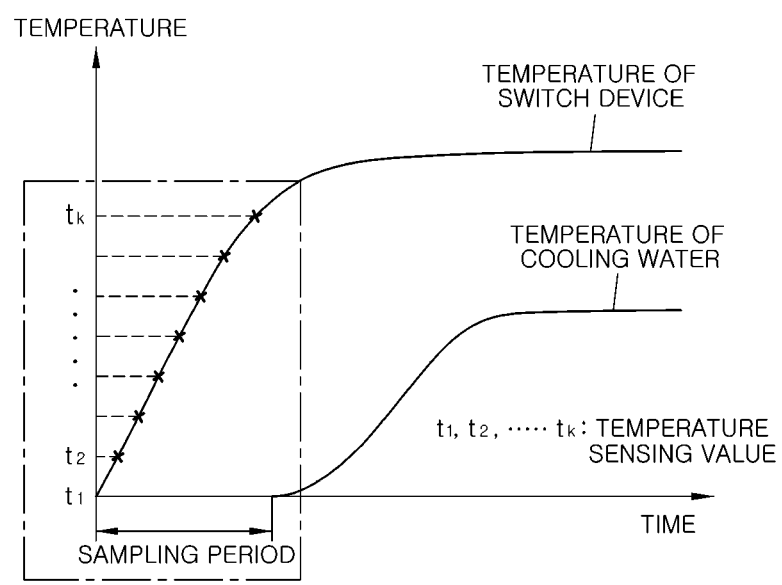
FIG. 1 is a graph showing a rate of temperature change per unit time of a temperature of a switch device and a temperature of cooling water according to an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, a light module for a vehicle according to exemplary embodiments of the present invention will be described with reference to the accompanying drawings.

A switch device 10 proposed by the present invention may include an insulated gate bipolar transistor (IGBT) used in an inverter and the like and configured to generate a substantial amount of heat since the switch device 10 is repeatedly turned on/off at very high speed. Accordingly, to dissipate the heat, the switch device 10 may further include a separate cooling system and a water cooling system is widely used as the cooling system.

Conventionally, to measure heat generated from the switch device 10 including a water cooling system, basically, a temperature sensor 20 installed in the switch device 10 and the temperature sensor 20 or flow sensor installed in a cooling flow channel 30 have been used. A quantity of heat generated from the switch device 10 is absorbed into the switch device 10 or cooling water 40 except for a minimal amount of heat spread into the atmosphere.

The present invention proposes a method of more accurately predicting a temperature of the switch device 10 in a specific situation without requiring a separate temperature sensor 20 or flow sensor in the cooling flow channel 30. Particularly, the specific situation is a sampling period illustrated in FIG. 2. The sampling period may be set using a temperature detected by the temperature sensor 20 of the switch device 10 and a temperature of the cooling water 40 for cooling the switch device 10 in a controller 60. The method of setting the sampling period may be based on a graph of FIG. 1.

FIG. 1 is a graph showing a rate of temperature change per unit time of a temperature of the switch device 10 and a temperature of the cooling water 40 due to heat generated by the switch device 10. As seen from FIG. 1, the temperature of the switch device 10 increases due to generated heat and is stabilized by a cooling system after a predetermined time elapses and, thus, converges on a predetermined temperature.

Furthermore, the temperature of the cooling water 40 is not initially changed (e.g., initially remains constant) and increases after a predetermined time elapses due to a time required to transfer heat of the switch device 10 to the cooling water 40 and a time required to increase the temperature due to heat capacity of the cooling water 40. Thus, the present invention proposes a method of setting a period in which the temperature of the cooling water 40 is not changed (e.g., remains constant) as a sampling period and more accurately estimating the temperature of the switch device 10 without a separate sensor. Accordingly, the sampling period according to the present invention refers to a time period in which the temperature detected by the temperature sensor 20 increases while the temperature of the cooling water 40 remains constant as time elapses, as illustrated in FIG. 1.

For example, the switch device 10 may be a switch device configured to adjust current required to drive a motor. In particular, the switch device 10 may be an IGBT device configured to adjust current applied to a driving motor. Accordingly, in setting (S10) of the sampling period, the controller may be configured to set, as the sampling period, a time period in which the temperature detected by the temperature sensor increases while the temperature of the cooling water remains constant as time elapses during operation of the switch device 10 to switch a motor to a driving state from a stop state.

Upon switching the motor to the driving state from the stop state, the controller 60 may be configured to operate the switch device 10 to output a greater amount of current than actually required current for a short period of time and start the sampling period from a time point at which current output from the switch device 10 is re-lowered and desired required current is output. When required current to be supplied to a driving motor by the switch device 10 is minimal, a temperature difference between the switch device 10 and cooling water is minimal and, thus, it may be difficult to compare the temperatures. Accordingly, according to the present invention, a maximum amount of current may be output from the switch device 10 for a short period of time when motor driving is started, and a period in which a temperature is abruptly changed is initially determined and sampled to compare temperatures and, thus, whether failure of the temperature sensor 20 of the switch device 10 occurs may be more accurately determined.

Figure 2:
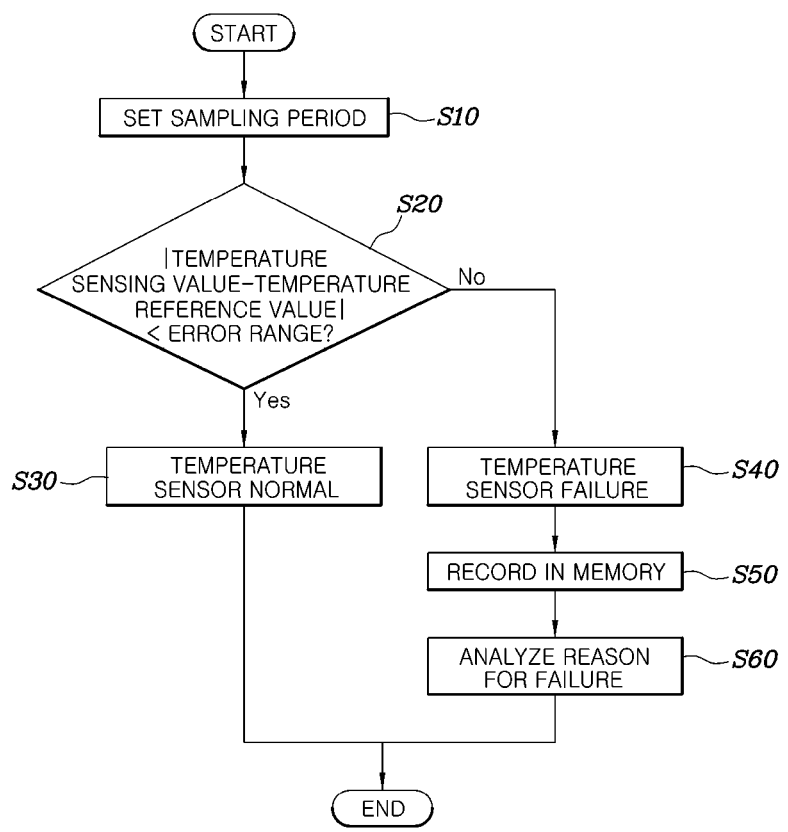
FIG. 2 is a flowchart of a failure diagnosis method of a temperature sensor of a switch device according to an exemplary embodiment of the present invention.

After the sampling period is set in the setting (S10) of the sampling period, the controller may be configured to compare (S20) a temperature sensing value and a temperature reference value as illustrated in FIG. 2. In particular, the temperature sensing value and the temperature reference value may be compared at a preset reference time interval in the sampling period. The reference time may have various values according to designer requirements and, as the reference time is reduced, the accuracy of temperature sensing of the switch device 10 may be enhanced. However, the controller 60 may be overloaded and, thus, the reference time needs to be appropriately selected (Values $t_1$, $t_2$, through, $t_k$ in the sampling period of FIG. 1 refer to temperature sensing values in the present invention.).

The temperature sensing values may be sensed by the temperature sensor 20 installed within the switch device 10 and, thus, a sensed value may be used without being changed, but the temperature reference value to be compared with the temperature sensing value may be determined based on an amount of heat absorbed into the switch device 10 and an amount of heat transferred to the cooling water 40 from the switch device 10. In particular, the temperature reference value may be derived according to the following equation.

$$T_1(t)=T_1(0)-T_2(0)-c*m*R_{th})*\exp(-t/(c*m*R_{th}))+T_2(0)+c*m*R_{th}$$

wherein $T_1(t)$: temperature reference value after time t elapses in sampling period, $T_1(0)$: initial temperature sensing value in sampling period, $T_2(0)$: initial temperature of the cooling water 40 in the sampling period, c: specific heat of the switch device 10, m: mass of the switch device 10, $R_{th}$: synthesized thermal resistance.

Particularly, the synthesized thermal resistance may be obtained by summing thermal resistance of an IGBT and thermal resistance of the cooling water 40 and the IGBT and the cooling water 40 may be connected to each other in series and, thus, even when the synthesized thermal resistance is determined, there is no significant error from which to derive the temperature reference value.

As seen from the above equation, the equation represents a solution of a differential equation and, as described above, since the temperature of the cooling water 40 has a constant value in the sampling period, the temperature of the cooling water 40 does not correspond to a variable and, thus, the temperature of the cooling water 40 may be calculated as a constant and calculated in the form of a differential equation for the temperature of the switch device 10 according to the above equation. However, how an initial temperature of the cooling water 40 in the sampling period needs to be determined in the above equation, but the initial temperature of the cooling water 40 is a temperature of the cooling water 40 when heat is not generated from the switch device 10 and, thus, the initial temperature of the cooling water 40 may be measured and determined and, then, a measured temperature may be continuously used.

In particular, the comparing (S20) of the temperature sensing value and the temperature reference value includes comparing whether a difference between the temperature sensing value and the temperature reference value is less than a preset error range, as illustrated in FIG. 2. When the difference between the temperature sensing value and the temperature reference value is less than the error range, the temperature sensor 20 may be determined to be normal (S30) (e.g., without malfunction or failure) and when the difference between the temperature sensing value and the temperature reference value is equal to or greater than the error range, failure of the temperature sensor 20 may be determined (S40).

The error range may be an error value generated between the temperature sensing value detected using a sensor and the temperature reference value theoretically derived and may be considered as a margin value for an exemplary embodiment of the present invention. Accordingly, the error range may have various values according to the accuracy of the temperature sensor 20 or designer requirements. In addition, the temperature reference value may be stored in a memory 50. In particular, the memory 50 may be a storage space in the controller 60, such as a read only memory (ROM) as well as a separate memory 50 extraneous to the controller 60.

According to the present invention, when failure occurs in the temperature sensor 20, the cause of failure of the temperature sensor 20 may be analyzed irrespective of when the difference between the temperature sensing value and the temperature reference value is less than an error range and the temperature sensor 20 is determined to be normal. In particular, as illustrated in FIG. 2, after determining (S40) the failure in the temperature sensor 20, a time when failure occurs in the temperature sensor 20 in the sampling period or a temperature sensing value when failure is determined to occur in the temperature sensor 20 may be stored in the memory 50 through recording (S50) in the memory 50. Then, the cause of the failure of the temperature sensor 20 may be analyzed (S60) based on information stored in the memory 50 and, according to the present invention, the cause of the failure may broadly include failure due to contact inferiority and failure due to short circuit.

When contact inferiority occurs in the temperature sensor 20, contact or noncontact occurs in the temperature sensor 20 and, thus, failure diagnosis of the temperature sensor 20 through the temperature sensing value is not inevitably constant. Accordingly, when the time for failure diagnosis of the temperature sensor 20 stored in the memory 50 is aperiodically distributed in the sampling period, the cause of the failure of the temperature sensor 20 may be determined to be contact inferiority.

Further, when the temperature sensor 20 is short circuited, the temperature of the switch device 10 may not be detected using the temperature sensor 20 and, thus, the temperature sensing value detected through the temperature sensor 20 is inevitably constant. Accordingly, when temperature sensing values stored in the memory 50 are the same, the cause of the failure of the temperature sensor 20 may be determined to be a short circuit.

Figure 3:
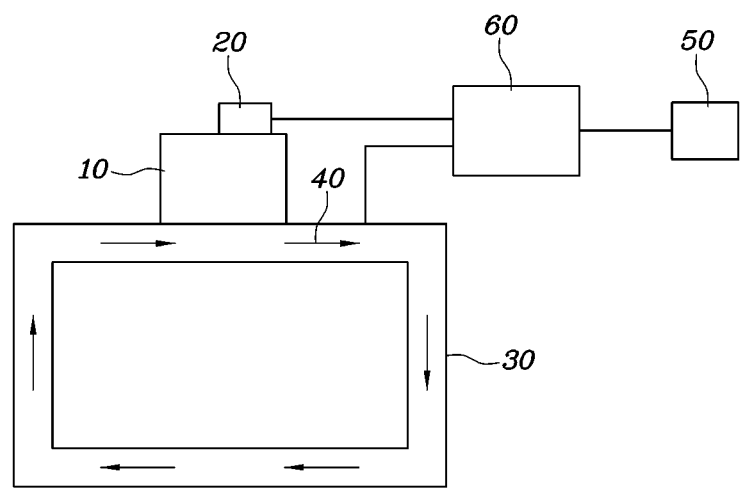
FIG. 3 is a diagram illustrating a structure of a failure diagnosis system of a temperature sensor of a switch device according to an exemplary embodiment of the present invention.

According to the present invention, a failure diagnosis system of the temperature sensor 20 of the switch device 10 may include the temperature sensor 20 configured to detect temperature of the switch device 10, the cooling flow channel 30 and the cooling water 40 for cooling the switch device 10, the memory 50 configured to store the temperature reference value, and the controller 60 configured to set a sampling period using the temperature detected by the temperature sensor 20 and the temperature of the cooling water 40 and compare the temperature reference value and the temperature sensing value detected by the temperature sensor 20 in the sampling period to determine whether failure occurs in the temperature sensor 20, as illustrated in FIG. 3.

As is apparent from the above description, according to the present invention, when whether failure occurs in a temperature sensor of a switch device is determined, a predicted value of temperature of the switch device may be estimated without an additional temperature and flow sensor of cooling water to determine whether failure occurs, thereby reducing costs for additionally installing a sensor and reducing system complexity, and whether failure occurs in a temperature sensor of the switch device may be determined as an important aspect in terms of safety of a power system, thereby enhancing the safety and reliability of the power system.

Although the exemplary embodiments of the present invention have been described above with reference to the accompanying drawings, those skilled in the art will appreciate that the present invention can be implemented in various other exemplary embodiments without changing the technical ideas or features thereof.

What is claimed is:

1. A failure diagnosis method of a temperature sensor of a switch device, comprising:
    setting, by a controller, a sampling period using a temperature detected by the temperature sensor of the switch device and a temperature of cooling water for cooling the switch device; and
    comparing, by the controller, a temperature sensing value detected by the temperature sensor and a temperature reference value stored in a memory of the controller in the sampling period and determining whether a failure occurs in the temperature sensor,
    wherein the controller is configured to determine the failure occurs in the temperature sensor when a difference between the temperature sensing value and the temperature reference value after a reference time elapses in the sampling period is equal to or greater than an error range.

2. The method according to claim 1, wherein the setting of the sampling period includes:
    setting, by the controller, as the sampling period, a time period in which the temperature detected by the temperature sensor is increased while the temperature of the cooling water remains constant as time elapses.

3. The method according to claim 1, wherein:
    the switch device is configured to adjust current required to drive a motor; and
    the setting of the sampling period includes setting, as the sampling period, a time period in which the temperature detected by the temperature sensor is increased while the temperature of the cooling water remains constant as time elapses during operation of the switch device to switch the motor to a driving state from a stop state.

4. The method according to claim 3, wherein:
    the controller is configured to operate the switch device to output a greater amount of current than required current when the motor is switched to the driving state from the stop state; and
    the sampling period is started from a time point at which the switch device outputs the required current.

5. The method according to claim 1, wherein the determination of whether the failure occurs includes:
    comparing, by the controller, the temperature sensing value and the temperature reference value at a preset reference time interval in the sampling period; and
    determining, by the controller, whether the failure occurs in the temperature sensor.

6. The method according to claim 5, wherein the temperature reference value is determined based on an amount of heat absorbed into the switch device and an amount of heat transferred to the cooling water.

7. The method according to claim 5, wherein the temperature reference value is determined according to the following equation:

$$T_1(t)=(T_1(0)-T_2(0)-c*m*R_{th})*\exp(-t/(c*m*R_{th}))+T_2(0)+c*m*R_{th}$$

wherein $T_1(t)$: temperature reference value after time t elapses in sampling period, $T_1(0)$: initial temperature sensing value in sampling period, $T_2(0)$: initial temperature of cooling water in sampling period, c: specific heat of switch device, m: mass of switch device, and $R_{th}$: synthesized thermal resistance.

8. The method according to claim 5, wherein the controller is configured to determine the temperature sensor to be normal when the difference between the temperature sensing value and the temperature reference value after the reference time elapses in the sampling period is less than a preset error range and determine that failure occurs in the temperature sensor when the difference between the temperature sensing value and the temperature reference value after the reference time elapses is equal to or greater than the error range.

9. The method according to claim 8, further comprising:
    storing, by the controller, in the memory, a time when failure occurs in the temperature sensor in the sampling period; and
    analyzing, by the controller, a cause of the failure of the temperature sensor as contact inferiority when the time stored in the memory is aperiodically distributed in the sampling period.

10. The method according to claim 8, further comprising:
storing, in the memory, the temperature sensing value when failure occurs in the temperature sensor in the sampling period; and
analyzing, by the controller, a cause of the failure of the temperature sensor as short circuit when temperature sensing values stored in the memory are the same.

11. A failure diagnosis system of a temperature sensor of a switch device, comprising:
the temperature sensor configured to detect a temperature of the switch device;
a cooling flow channel and cooling water that cool the switch device;
a memory configured to store a temperature reference value; and
a controller configured to set a sampling period using the temperature detected by the temperature sensor and the temperature of the cooling water, compare the temperature reference value and the temperature sensing value detected by the temperature sensor in the sampling period to determine whether a failure occurs in the temperature sensor,
wherein the controller is configured to determine the failure occurs in the temperature sensor when a difference between the temperature sensing value and the temperature reference value after a reference time elapses in the sampling period is equal to or greater than an error range.

12. The system according to claim 11, wherein the controller is configured to set a time period in which the temperature detected by the temperature sensor is increased while the temperature of the cooling water remains constant, as the sampling period.

13. The system according to claim 11, wherein the temperature reference value is determined according to the following equation:

$$T_1(t)=(T_1(0)-T_2(0)-c*m*R_{th})*\exp(-t/(c*m*R_{th}))+T_2(0)+c*m*R_{th}$$

wherein $T_1(t)$: temperature reference value after time t elapses in sampling period, $T_1(0)$: initial temperature sensing value in sampling period, $T_2(0)$: initial temperature of cooling water in sampling period, c: specific heat of switch device, m: mass of switch device, and $R_{th}$: synthesized thermal resistance.

* * * * *